(12) United States Patent
Yang et al.

(10) Patent No.: US 6,696,331 B1
(45) Date of Patent: Feb. 24, 2004

(54) METHOD OF PROTECTING A STACKED GATE STRUCTURE DURING FABRICATION

(75) Inventors: Nian Yang, San Jose, CA (US);
Zhigang Wang, Santa Clara, CA (US);
Hsiao-Han Thio, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/217,807

(22) Filed: Aug. 12, 2002

(51) Int. Cl.$^7$ ............................................ H01L 21/8238
(52) U.S. Cl. ........................................ 438/211; 438/258
(58) Field of Search .............................. 438/201, 211, 438/258, 275, 594, 595

(56) References Cited

U.S. PATENT DOCUMENTS 5,766,996 A * 6/1998 Hayakawa et al. ......... 438/261
6,096,602 A * 8/2000 Kim et al. .................. 438/211
6,221,708 B1 * 4/2001 Gonzalez et al. ........... 438/261
6,228,717 B1 * 5/2001 Hazama et al. ............. 438/265

OTHER PUBLICATIONS

Wolf, "Silicon Processing for the VLSI Era", 1986, vol. 1, p. 518.*

* cited by examiner

Primary Examiner—Chandra Chaudhari

(57) ABSTRACT

A method of protecting a stacked gate structure of a flash memory device during fabrication is disclosed. Additionally, the manner of protecting the stacked gate structure during fabrication is simple to implement and is cost-effective. In particular, a protective layer is deposited on the stacked gate structure to protect the stacked gate structure before a resist removal process is performed a second time. Despite undergoing two resist removal processes, the stacked gate structure suffers less damage than the convention fabrication techniques, increasing the yield and reliability of the flash memory device.

38 Claims, 7 Drawing Sheets

METHOD OF PROTECTING A STACKED GATE STRUCTURE DURING FABRICATION

BACKGROUND OF THE INVENTION

1. Field of the Invention

The present invention generally relates to semiconductor fabrication processes. More particularly, the present invention relates to the field of fabricating stacked gate structures.

2. Related Art

Semiconductor fabrication processes have made possible the fabrication of advanced integrated circuits on a semiconductor wafer. These semiconductor fabrication processes are complex, requiring extensive control and care to avoid fabricating defective integrated circuits. Moreover, within the advanced integrated circuits, specialized components are utilized to implement particular functionality. As a result, the advanced integrated circuits undergo a first group of semiconductor fabrication processes to fabricate standard components and undergo a second group of semiconductor fabrication processes to fabricate the specialized components.

In particular, a flash memory chip has a memory array and a plurality of support and control circuits. Generally, the memory array is comprised of a plurality of flash memory devices (or cells), whereas the memory array is known as the core area of the flash memory chip. Each flash memory device includes a stacked gate structure. The stacked gate includes a tunnel oxide layer, a floating gate layer for storing charge, an ONO (Oxide-Nitride-Oxide) layer, and a control gate layer for programming and erasing the flash memory device. The support and control circuits are typically comprised of standard components such as MOS (Metal Oxide Semiconductor) transistors having gate structures, whereas the support and control circuits are typically formed in the peripheral area of the flash memory chip. The gate structure includes a gate oxide layer and a gate layer.

In the fabrication of the flash memory chip, a first lithographic process, a first etching process, and a resist removal process are performed to form the stacked gate structure of the flash memory device. Separately, a second lithographic process, a second etching process, and the resist removal process are performed to form the gate structure of the MOS transistor. Typically, the stacked gate structure is formed in the core area and then the gate structure is formed in the peripheral area.

FIG. 1 illustrates a conventional stacked gate structure 90 of a flash memory device 100 after the stacked gate resist removal process has been performed. The conventional stacked gate structure 90 is formed on a substrate 60. The conventional stacked gate structure 90 includes a tunnel oxide layer 10, a floating gate layer 20 for storing charge, an ONO (Oxide-Nitride-Oxide) layer 30, and a control gate layer 40 for programming and erasing the flash memory device 100. Moreover, the conventional stacked gate structure 90 further includes an ARC (Anti-Reflective Coating) layer 50 for facilitating the lithographic process.

As noted above, a first lithographic process is performed to form a stacked gate resist layer for patterning the conventional stacked gate 90 of the flash memory device 100. The stacked gate resist layer is also deposited on the peripheral area where the support and control circuits are formed. Then, a first etching process is performed to define the conventional stacked gate 90. Thereafter, a resist removal process is performed to remove the stacked gate resist layer. Since the stacked gate resist layer has to be removed as completely as possible because the stacked gate resist layer covers the peripheral area where the support and control circuits are formed, the resist removal process is a harsh clean procedure. Thus, the conventional stacked gate structure 90 is subjected to excess clean.

As depicted in FIG. 1, the resist removal process damages the tunnel oxide layer 10 at edge 78 and at edge 76. For example, the resist removal process can damage approximately 30–50 angstroms of the tunnel oxide layer 10 at edge 78 and at edge 76. Moreover, the resist removal process damages the ONO layer 30 at edge 74 and at edge 72. For example, the resist removal process can damage approximately 30–50 angstroms of the ONO layer 30 at edge 74 and at edge 72.

The damage (manifested by degradation in dielectric properties) to the tunnel oxide layer 10 and the ONO layer 30 can cause reliability problems with charge storage/retention in the floating gate 20, reducing yield and reliability of flash memory products. Additionally, the damage can lead to fast bit problems where the flash memory device 100 is difficult to control. Unfortunately, the conventional stacked gate structure 90 again undergoes the resist removal process, magnifying the damage and problems. This time the resist removal process is associated with formation of the gate structure of a MOS transistor. Therefore, the formation of the gate structure of a MOS transistor adversely affects the stacked gate structure 90.

FIG. 2 illustrates a conventional stacked gate structure 90 of a flash memory device 100 after the gate resist removal process has been performed. As noted above, a second lithographic process is performed to form a gate resist layer for patterning the gate structure of a MOS transistor. The gate resist layer is also deposited on the conventional stacked gate structure 90. Then, a second etching process is performed to define the gate structure. However, the conventional stacked gate structure 90 does not undergo this second etching process. Thereafter, the resist removal process is performed again to remove the gate resist layer. Since the gate resist layer has to be removed as completely as possible because the gate resist layer covers the stacked gate structure 90, the resist removal process is a harsh clean procedure.

As depicted in FIG. 2, the resist removal process increases the damage to the tunnel oxide layer 10 at edge 88 and at edge 86. For example, the resist removal process can cause an additional damage to approximately another 30–50 angstroms of the tunnel oxide layer 10 at edge 88 and at edge 86. Moreover, the resist removal process increases the damage to the ONO layer 30 at edge 84 and at edge 82. For example, the resist removal process can cause an additional damage to approximately another 30–50 angstroms of the ONO layer 30 at edge 84 and at edge 82.

Thus, after two resist removal processes, the tunnel oxide layer 10 and the ONO layer 30 may be damaged by approximately 120–200 angstroms. This damage becomes more significant as the dimensions of the conventional stacked gate 90 are reduced, amplifying the yield and reliability problems described above.

What is needed is a method of protecting a stacked gate structure during fabrication. Moreover, what is needed is a method of protecting the stacked gate structure during fabrication that is simple to implement and is cost-effective.

SUMMARY OF THE INVENTION

A method of protecting a stacked gate structure during fabrication is disclosed. Additionally, the present invention provides protection for the stacked gate structure during fabrication in a manner that is simple to implement and is cost-effective.

According to one embodiment of the method of protecting the stacked gate structure of a flash memory device on a semiconductor wafer during fabrication, a resist removal process is performed to remove a first resist layer which defines the stacked gate structure. Then, a protective layer is deposited on the stacked gate structure to protect the stacked gate structure during the resist removal process. The resist removal process is repeated to remove a second resist layer which defines the gate structure of a MOS transistor. The protective layer has a sufficient thickness to protect the stacked gate structure during the resist removal process without interfering with the fabrication processes for forming the gate structure of the MOS transistor. The protective layer can be a material such as silicon-rich nitride, silicon oxynitride, or silicon dioxide. Despite undergoing two resist removal processes, the stacked gate structure suffers less damage than the convention fabrication techniques, increasing the yield and reliability of the flash memory device.

These and other advantages of the present invention will no doubt become apparent to those of ordinary skill in the art after having read the following detailed description of the preferred embodiments, which are illustrated in the drawing figures.

BRIEF DESCRIPTION OF THE DRAWINGS

The accompanying drawings, which are incorporated in and form a part of this specification, illustrate embodiments of the invention and, together with the description, serve to explain the principles of the present invention.

DETAILED DESCRIPTION OF THE INVENTION

Reference will now be made in detail to the preferred embodiments of the present invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention.

A method of protecting a stacked gate structure during fabrication is disclosed. Additionally, this method provides protection for the stacked gate structure during fabrication in a manner that is simple to implement and is cost-effective.

Figure 3:
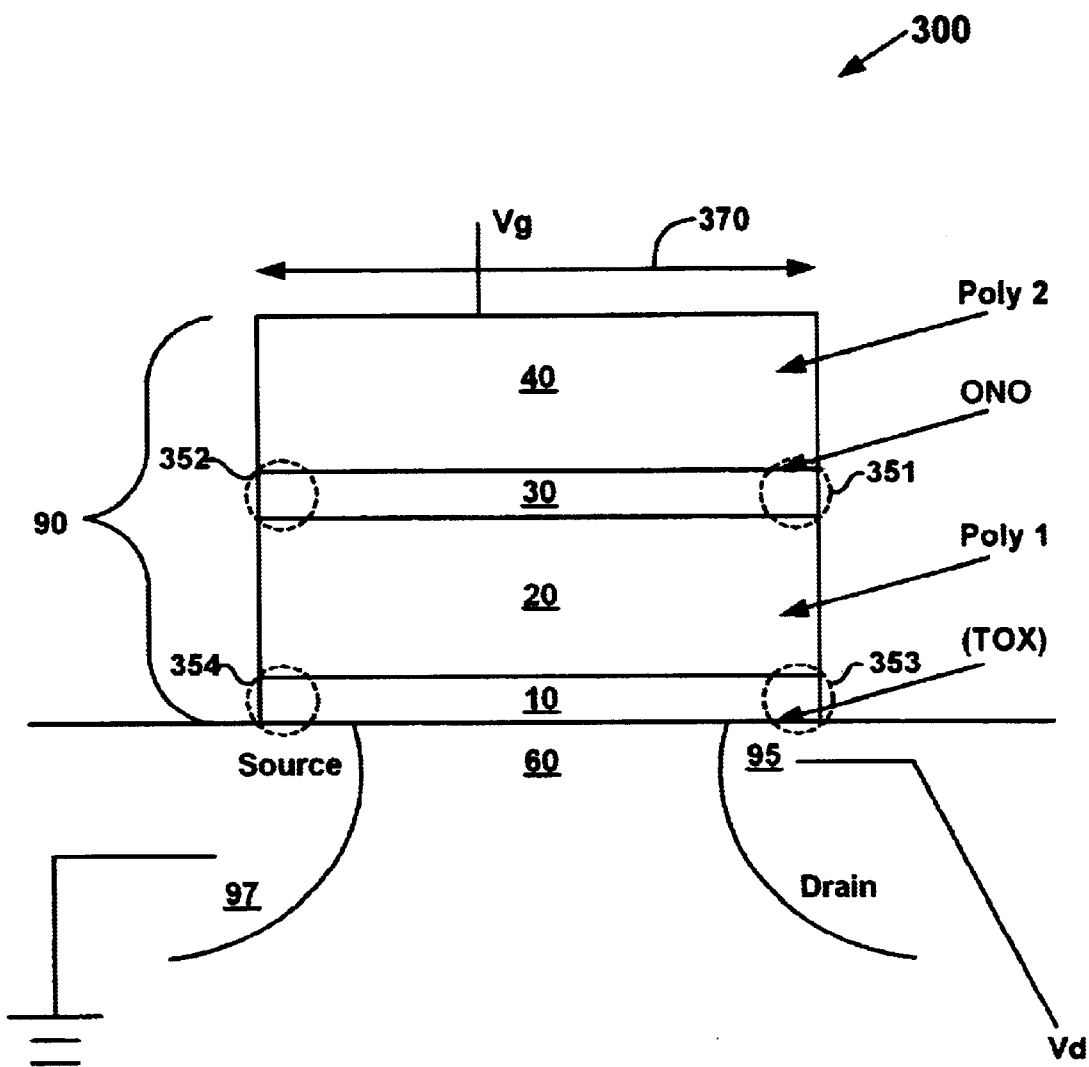
FIG. 3 illustrates a flash memory device in accordance with an embodiment of the present invention, showing a stacked gate structure.

FIG. 3 illustrates a flash memory device 300 in accordance with an embodiment of the present invention, showing a stacked gate structure 90. The method of the present invention is utilized to fabricate an integrated circuit device (that includes the flash memory device 300 as well as other components such as MOS transistors) on a semiconductor wafer while providing protection for the stacked gate structure 90 during fabrication. The integrated circuit device can be a flash memory chip or any other type of chip. The semiconductor wafer can be a silicon wafer or any other type of semiconductor wafer.

As shown in FIG. 3, the flash memory device 300 is fabricated on a substrate 60. Typically, the substrate 60 is comprised of silicon which is doped with a dopant material such as a p-type dopant or an n-type dopant. The flash memory device 300 includes a stacked gate structure 90, a doped source node 97, and a doped drain node 95. The flash memory device 300 is typically operated with the doped source node 97 coupled to ground while a gate voltage $V_g$ is applied to the stacked gate structure 90 and a drain voltage $V_d$ is applied to the doped drain node 95.

In an embodiment, the stacked gate structure 90 includes a tunnel oxide layer 10, a floating gate layer 20 comprised of a first polysilicon (Poly1), a ONO layer 30, and a control gate layer 40 comprised of a second polysilicon (Poly2). The first polysilicon 20 and second polysilicon 40 may be doped with a dopant material. The oxide for the tunnel oxide layer 10 and the ONO layer 30 can be a dielectric such as silicon dioxide, silicon oxynitride, or any other high-k dielectric used in semiconductor fabrication. The thickness of the tunnel oxide layer 10, the floating gate layer 20, the ONO layer 30, and the control gate layer 40 can be a variety of values. For example, the tunnel oxide layer 10 is approximately 100 angstroms, the floating gate layer 20 is approximately 1000 angstroms, the ONO layer 30 is approximately 130 angstroms, and the control gate layer 40 is approximately 2000 angstroms in one embodiment. Moreover, the length 370 of the stacked gate structure 90 may be a variety of values such as 4000 angstroms or 2600 angstroms.

As described above, the edges 351–354 of the tunnel oxide layer 10 and the ONO layer 30 can be damaged during fabrication by a resist removal process. Unlike the conventional fabrication techniques, the stacked gate structure 90 is protected during fabrication. Thus, the fabrication method of the present invention minimizes the damage to the edges 351–354 compared to conventional fabrication techniques, increasing yields and reliability of the flash memory device 300.

In particular, according to one embodiment of the method of protecting the stacked gate structure 90 of the flash memory device 300 on a semiconductor wafer during fabrication, a resist removal process is performed to remove a first resist layer which defines the stacked gate structure 90. Then, a protective layer is deposited on the stacked gate structure 90 to protect the stacked gate structure 90 during the resist removal process. The resist removal process is repeated to remove a second resist layer which defines the gate structure of a MOS transistor fabricated on the same semiconductor wafer. The protective layer has a sufficient thickness to protect the stacked gate structure 90 during the resist removal process without interfering with the fabrication processes for forming the gate structure of the MOS transistor. The protective layer can be a material such as silicon-rich nitride, silicon oxynitride, or silicon dioxide. Despite undergoing two resist removal processes, the stacked gate structure 90 suffers less damage than the convention fabrication techniques, enhancing yield and reducing defects in the fabrication of the flash memory device 300.

Figure 3A:
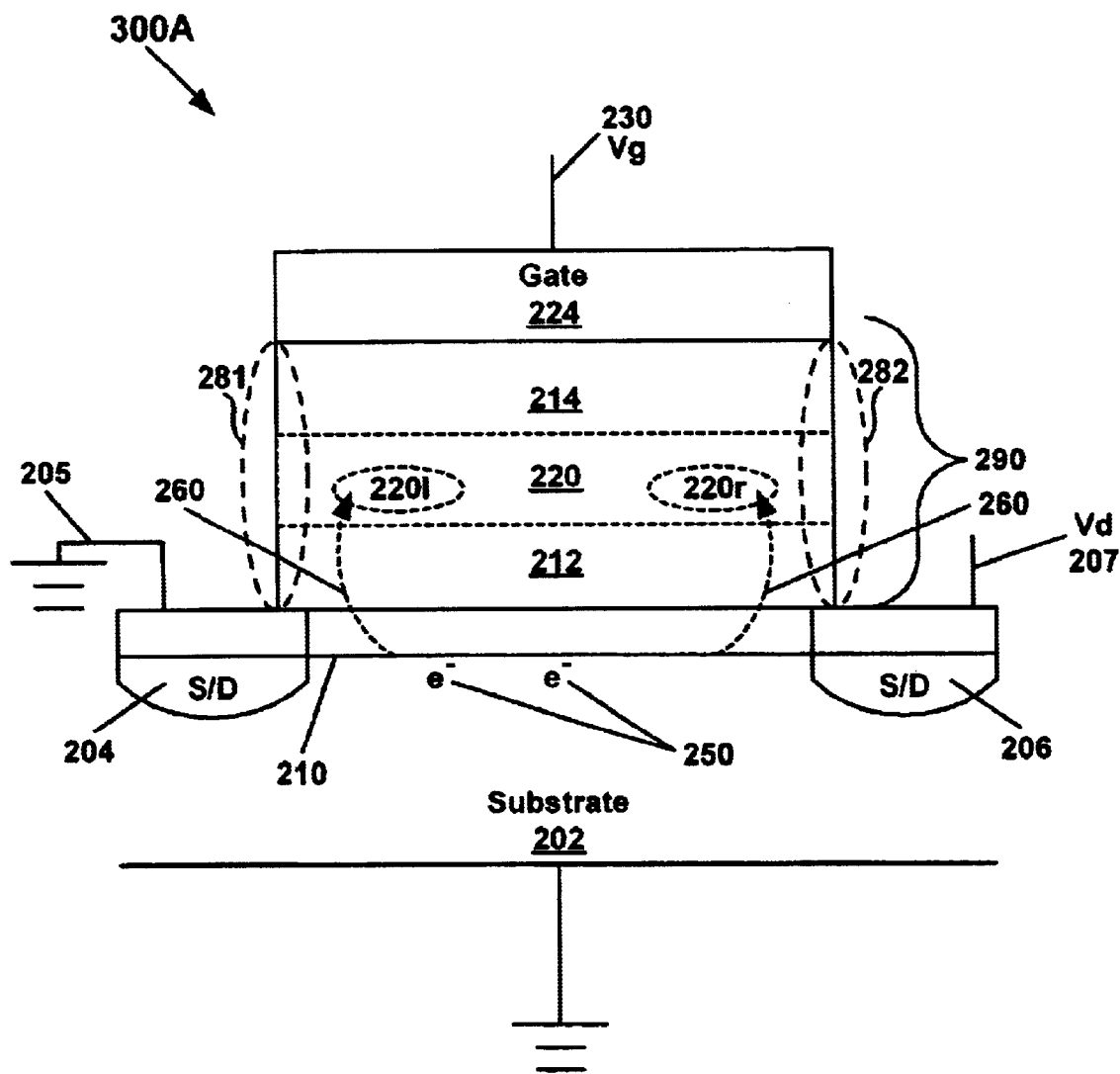
FIG. 3A illustrates a second flash memory device in accordance with an embodiment of the present invention, showing a stacked gate structure.

FIG. 3A illustrates a second flash memory device 300A in accordance with an embodiment of the present invention, showing a stacked gate structure 290. As depicted in FIG. 3A, the second flash memory device 300A is formed on a substrate 202. The substrate 202 is comprises of silicon which is doped with a dopant material such as a p-type dopant or an n-type dopant. In addition, the second flash memory device 300A includes selectable electrode regions, e.g., source/drain region (S/D) 204 and source/drain region (S/D) 206 and a channel 210. Moreover, the second flash memory device 300A has a stacked gate structure 290 which includes a first oxide layer 212, a second oxide layer 214, a nitride layer 220 (or charge storage region layer) representing a floating gate, and a control gate layer 224 comprised of a polysilicon material.

In the second flash memory device 300A, a selectable bi-directional current flow, from either S/D 204 to S/D 206, or from S/D 206 to S/D 204 is provided. Accordingly, depending upon the direction of the current flow within channel 210, electrons can be drawn from channel area 210 into either charge storage region 220l (left side) or charge storage region 220r (right side) of layer 220, as indicated by dotted lines 260. For example, when S/D 204 is selected as source, then electrons 250 are drawn to charge storage region 220r, and correspondingly, when S/D 206 is selected as source, then electrons 250 are drawn to charge storage region 220l. Regions 220l and 220r, as shown in FIG. 3A, are depicted as elliptically shaped entities for exemplary purposes and, as such, should not be construed as a limitation, but rather to illustrate that that regions 220l and 220r are disposed on each side of charge storage region layer 220. It is further noted that charge storage regions 220l and 220r are independent of each other, although disposed within the same charge storage region layer 220.

By virtue of layer 220 being comprised of nitride, a non-conductive material, when electrons are stored in charge storage region 220l or 220r, those electrons remain trapped in that side of charge storage region layer 220. By providing individual and independent storage of each of the two units of charge, instead of two states (0,1) of charge storage, four states (0,0; 0,1; 1,0; and 1,1) of charge storage are provided in the second flash memory device 300A. Therefore, each unit of charge can be programmed or erased, and a full charge can be stored at each side of charge storage region layer 220.

Referring still to FIG. 3A, the selectable source/drain region 204 is coupled to a ground (e.g., ground 205), a voltage (e.g., $V_d$ 207) is applied to selectable source/drain region 206, and a voltage (e.g., $V_g$ 230) is applied to the control gate layer 224. Electrons, e.g., electrons 250, in substrate 202 are to be drawn into nitride layer 220 for programming.

The edges 281–282 of the stacked gate structure 290 can be damaged during fabrication by a resist removal process.

Unlike the conventional fabrication techniques, the stacked gate structure 290 is protected during fabrication. Thus, the fabrication method of the present invention minimizes the damage to the edges 281—281 compared to conventional fabrication techniques, increasing yields and reliability of the second flash memory device 300A.

In one embodiment of the method of protecting the stacked gate structure 290 of the second flash memory device 300A on a semiconductor wafer during fabrication, a resist removal process is performed to remove a first resist layer which defines the stacked gate structure 290. Then, a protective layer is deposited on the stacked gate structure 290 to protect the stacked gate structure 290 during the resist removal process. The resist removal process is repeated to remove a second resist layer which defines the gate structure of a MOS transistor fabricated on the same semiconductor wafer. The protective layer has a sufficient thickness to protect the stacked gate structure 290 during the resist removal process without interfering with the fabrication processes for forming the gate structure of the MOS transistor. The protective layer can be a material such as silicon-rich nitride, silicon oxynitride, or silicon dioxide. Despite undergoing two resist removal processes, the stacked gate structure 290 suffers less damage than the convention fabrication techniques, enhancing yield and reducing defects in the fabrication of the second flash memory device 300A.

Figure 4:
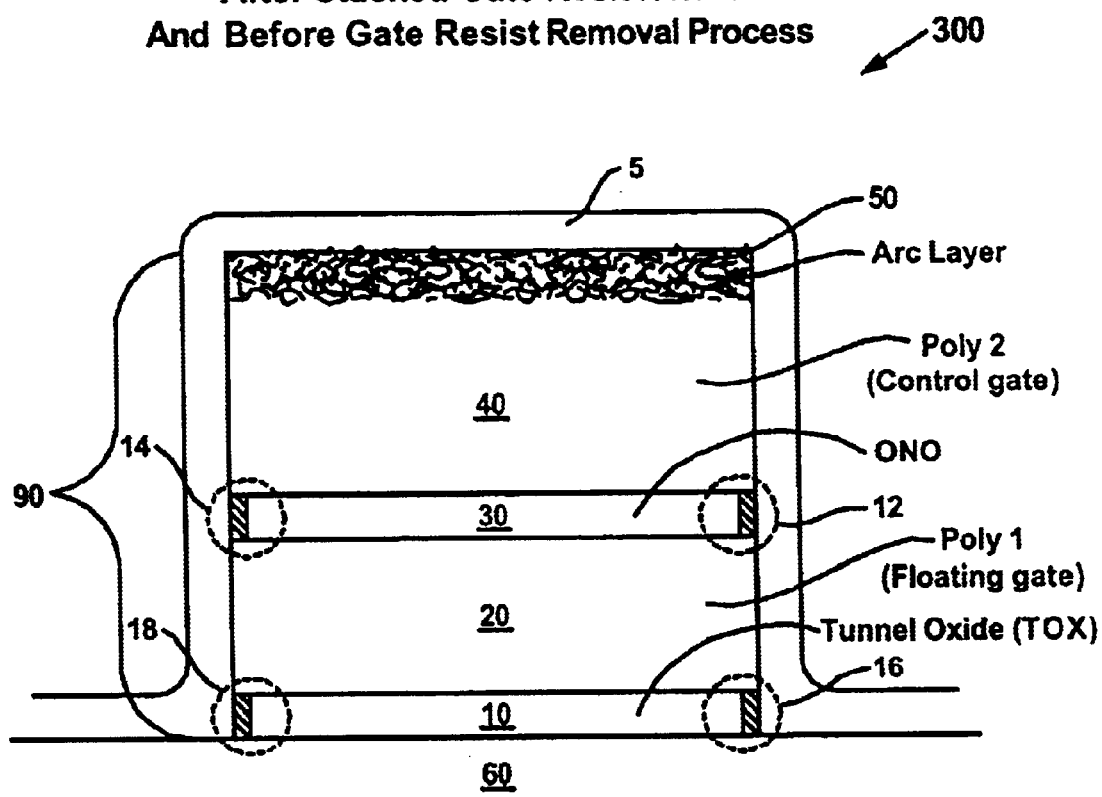
FIG. 4 illustrates a stacked gate structure of a flash memory device after the stacked gate resist removal process has been performed and before the gate resist removal process has been performed in accordance with an embodiment of the present invention.

FIG. 4 illustrates a stacked gate structure 90 of a flash memory device 300 of FIG. 3 after the stacked gate resist removal process has been performed and before the gate resist removal process has been performed in accordance with an embodiment of the present invention. It should be understood that the discussion with respect to the stacked gate structure 90 of the flash memory device 300 of FIG. 3 is applicable to the stacked gate structure 290 of the second flash memory device 300A of FIG. 3A. As described above, the stacked gate structure 90 is formed on a substrate 60. The stacked gate structure 90 includes a tunnel oxide layer 10, a floating gate layer 20, an ONO layer 30, and a control gate layer 40. Moreover, the stacked gate structure 90 further includes an ARC (Anti-Reflective Coating) layer 50 for facilitating the lithographic process. The ARC layer 50 is comprised of silicon-rich nitride. In an embodiment, the thickness of the ARC layer 50 is approximately 200–250 angstroms.

A first lithographic process is performed to form a stacked gate resist layer for patterning the stacked gate 90 of the flash memory device 300. The lithographic process can any type of lithographic process such as a photolithography process, a x-ray lithography process, etc. The stacked gate resist layer is also deposited on the area where the MOS transistors are formed. Then, a first etching process is performed to define the stacked gate 90. Thereafter, a resist removal process is performed to remove the stacked gate resist layer. In an embodiment, the resist removal process includes a plasma strip process that is anisotropic followed by a wet chemical clean process that is isotropic. Since the stacked gate resist layer has to be removed as completely as possible because the stacked gate resist layer covers the area where the MOS transistors are formed, the resist removal process is a harsh clean procedure.

As depicted in FIG. 4, after the first time the resist removal process is performed, the edges 16 and 18 of the tunnel oxide layer 10 appear damaged by the resist removal process. Moreover, the resist removal process damages the ONO layer 30 at edge 14 and at edge 12. As described above, the damage can be approximately 30–50 angstroms at each edge.

Figure 1:
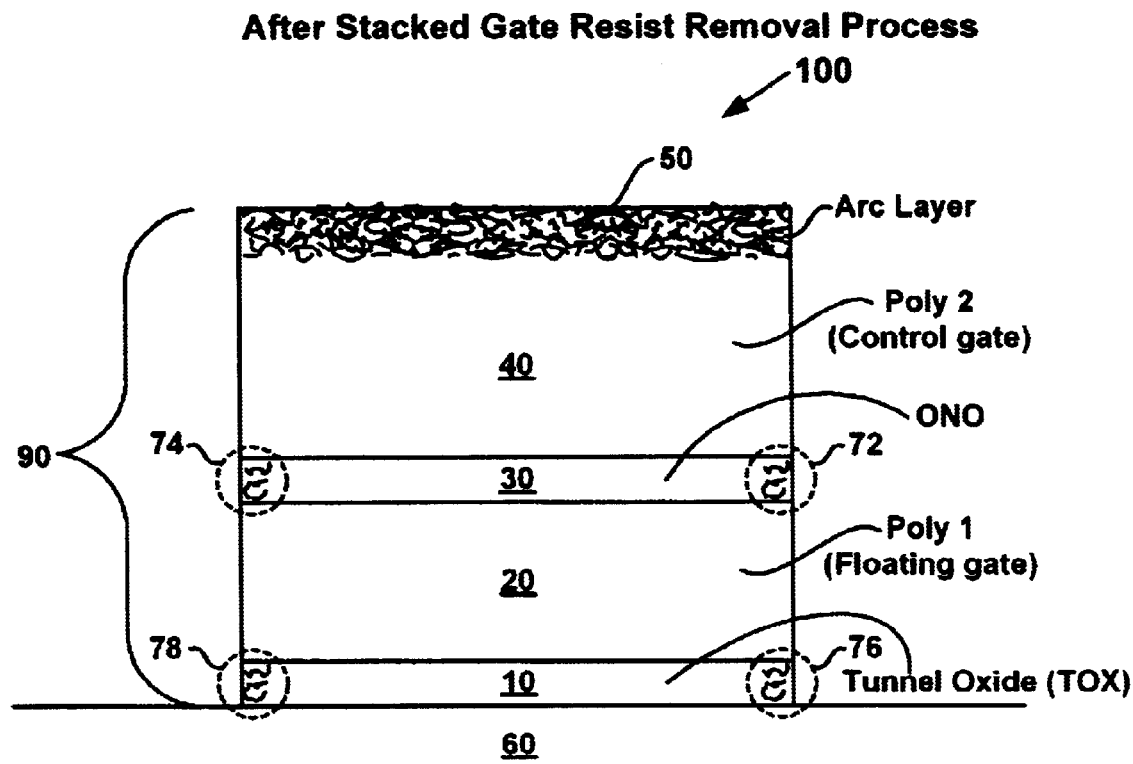
FIG. 1 illustrates a conventional stacked gate structure of a flash memory device after the stacked gate resist removal process has been performed.
Figure 2:
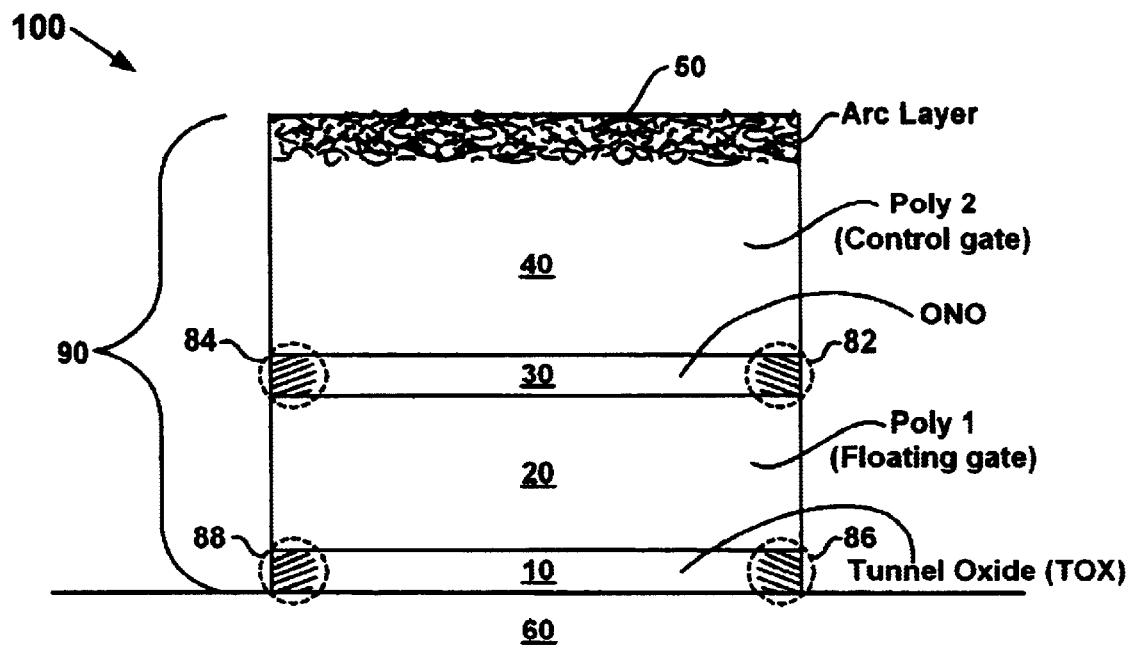
FIG. 2 illustrates a conventional stacked gate structure of a flash memory device after the gate resist removal process has been performed.

Unlike the conventional fabrication techniques described with respect to FIGS. 1 and 2, a protective layer 5 is deposited on the stacked gate structure 90 after the resist removal process is performed which removes the stacked gate resist that defines the stacked gate structure 90 of the flash memory device 300. Moreover, the protective layer 5 is deposited on the stacked gate structure 90 before the resist removal process is repeated to remove the gate resist that defines the gate structure of the MOS transistors. The protective layer 5 has a sufficient thickness to protect the stacked gate structure 90 during the resist removal process without interfering with other fabrication processes such as processes for forming the gate structure of the MOS transistor. The thickness of the protective layer 5 can be a variety of values. In an embodiment, the thickness of the protective layer 5 is approximately 30–50 angstroms. Alternatively, the thickness can be no greater than approximately 50 angstroms. Yet still, the thickness can be no less than approximately 30 angstroms. The protective layer can be a material such as silicon-rich nitride, silicon oxynitride, or silicon dioxide.

The protective layer 5 can be deposited using a deposition process such as a rapid thermal chemical vapor deposition process, a low pressure chemical vapor deposition process, or a plasma enhanced chemical vapor deposition process. Generally, a purely thermal deposition process should be avoided since it may cause the floating layer 20 and the control layer 40 to oxidize. Besides protecting the stacked gate structure 90, the deposition process can possibly repair some damage suffered by the tunnel oxide layer 10 and the ONO layer 30. A multitude of benefits arises from the protective layer 5. The stacked gate structure 90 is protected from excess clean that causes damage. Therefore, charge storage/retention and fast bit problems are minimized. Improvement in yields is observed. Moreover, the protection is simple to implement and cost-effective, avoiding any need for new tools, new processes, or new materials.

Figure 5:
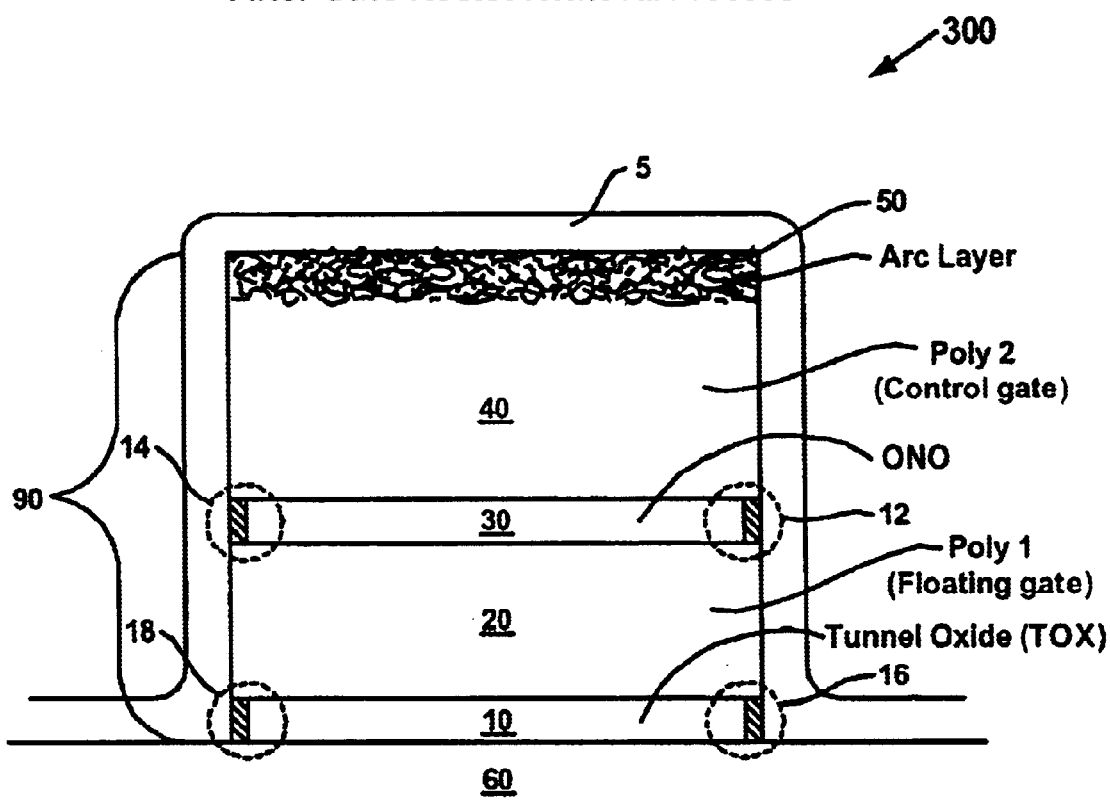
FIG. 5 illustrates a stacked gate structure of a flash memory device after the gate resist removal process has been performed in accordance with an embodiment of the present invention.

FIG. 5 illustrates a stacked gate structure 90 of a flash memory device 300 after the gate resist removal process has been performed in accordance with an embodiment of the present invention. It should be understood that the discussion with respect to the stacked gate structure 90 of the flash memory device 300 of FIG. 3 is applicable to the stacked gate structure 290 of the second flash memory device 300A of FIG. 3A. A second lithographic process is performed to form a gate resist layer for patterning the gate structure of a MOS transistor. The gate resist layer is also deposited on the stacked gate structure 90. Then, a second etching process is performed to define the gate structure of the MOS transistor. However, the stacked gate structure 90 does not undergo this second etching process. Thereafter, the resist removal process is repeated to remove the gate resist layer. Since the gate resist layer has to be removed as completely as possible because the gate resist layer covers the stacked gate structure 90, the resist removal process is a harsh clean procedure.

As depicted in FIG. 5, rather than increasing the damage to the tunnel oxide layer 10 at edges 18 and 16 and to the ONO layer 30 at edges 14 and 12, the repeated resist removal process causes some slight additional damage or no additional damage. Thus, after two resist removal processes, the tunnel oxide layer 10 and the ONO layer 30 may be damaged by approximately 60–100 angstroms or less instead of approximately 120–200 angstroms when using the conventional fabrication techniques. Despite undergoing two resist removal processes, the stacked gate structure 90 suffers less damage than the convention fabrication techniques, enhancing yield and reducing defects in the fabrication of the flash memory device 300.

Figure 6:
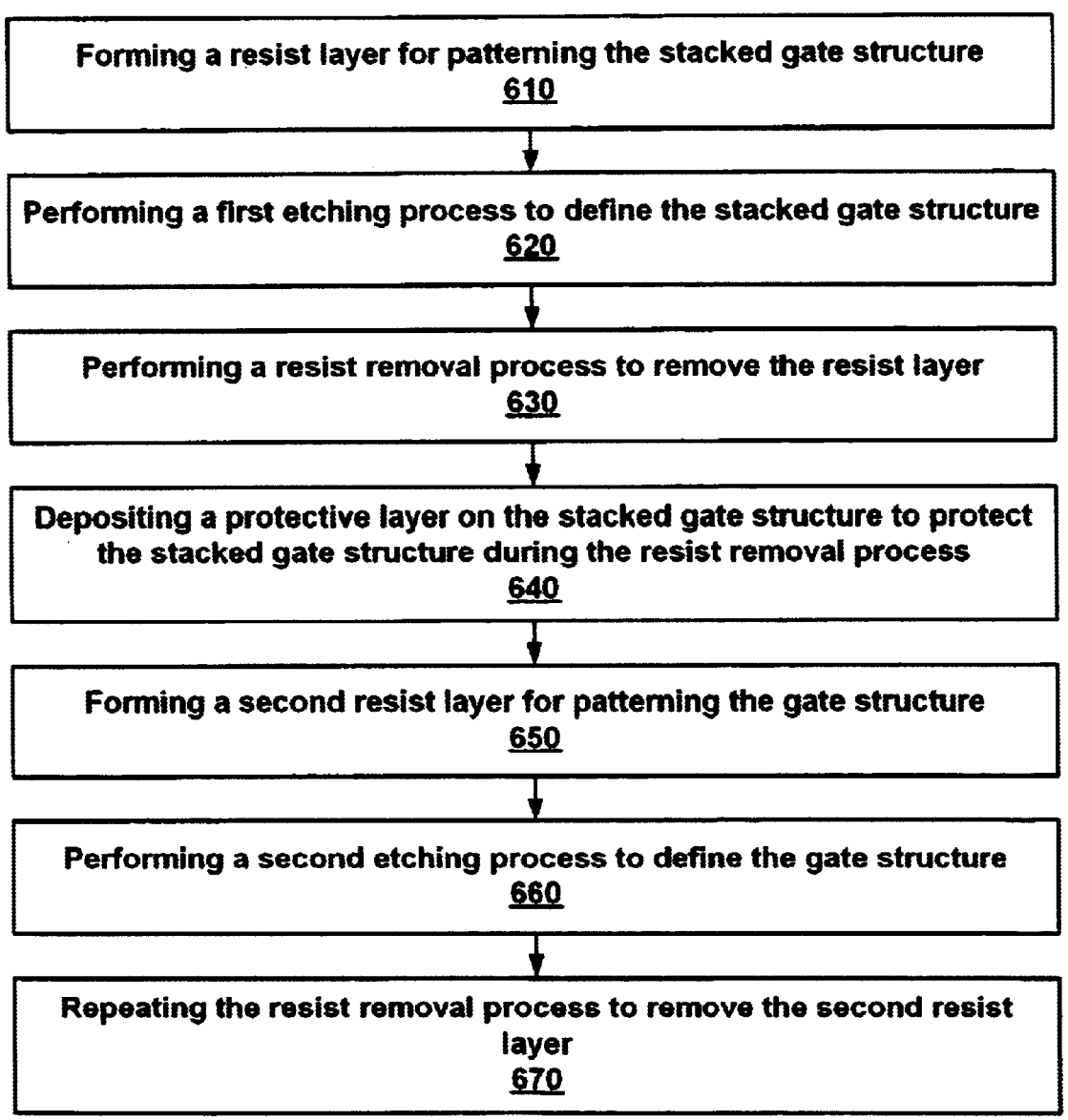
FIG. 6 illustrates a flow chart showing a method of fabricating an integrated circuit in accordance with an embodiment of the present invention.

FIG. 6 illustrates a flow chart showing a method 600 of fabricating an integrated circuit device in accordance with an embodiment of the present invention. The integrated circuit device includes the flash memory device 300 (FIGS. 3–5) as well as other components such as MOS transistors. Also, the integrated circuit device is fabricated on a semiconductor wafer while providing protection for the stacked gate structure 90 of the flash memory device 300 during fabrication. The integrated circuit device can be a flash memory chip or any other type of chip. The semiconductor wafer can be a silicon wafer or any other type of semiconductor wafer. Reference is made to FIGS. 3–5. It should be understood that the discussion with respect to the stacked gate structure 90 of the flash memory device 300 of FIG. 3 is applicable to the stacked gate structure 290 of the second flash memory device 300A of FIG. 3A. Initially, an ARC layer 50 is deposited on the area where the stacked gate structure 90 is to be formed. The ARC layer 50 can be comprised of silicon-rich nitride.

At Block 610, a stacked gate resist layer (or resist layer) for patterning the stacked gate structure 90 of the flash memory device 300 is formed (on the ARC layer 50) using a first lithographic process. In particular, the stacked gate resist layer is formed on top of the ARC layer 50 and is dimensioned according to the desired length 370 (FIG. 3) for the stacked gate structure 90. The stacked gate resist layer is also deposited on an area (where the MOS transistors are formed) to protect this area. At Block 620, a first etching process to define the stacked gate structure 90 is performed. The first etching process is utilized to remove multiple layers of materials that are not protected by the stacked gate resist layer. This creates the stacked gate structure 90.

Moreover, at Block 630, a resist removal process is performed. The resist removal process removes the stacked gate resist layer (from the stacked gate structure and from other areas) as completely as possible. In an embodiment, the resist removal process includes a plasma strip process that is anisotropic followed by a wet chemical clean process that is isotropic.

Furthermore, at Block 640, a protective layer 5 is deposited on the stacked gate structure 90. The thickness of the protective layer 5 can be a variety of values. In an embodiment, the thickness of the protective layer 5 is approximately 30–50 angstroms. Alternatively, the thickness can be no greater than approximately 50 angstroms. Yet still, the thickness can be no less than approximately 30 angstroms. The protective layer can be a material such as silicon-rich nitride, silicon oxynitride, or silicon dioxide. Moreover, the protective layer 5 can be deposited using a deposition process such as a rapid thermal chemical vapor deposition process, a low pressure chemical vapor deposition process, or a plasma enhanced chemical vapor deposition process.

At Block 650, a gate resist layer (or second resist layer) for patterning the gate structure of a MOS transistor is formed using a second lithographic process. The gate resist layer is also deposited on the stacked gate structure protect it during formation of the gate structure of the MOS transistor. Continuing, at Block 660, a second etching process to define the gate structure is performed. The second etching process is utilized to remove multiple layers of materials that are not protected by the gate resist layer. This creates the gate structure.

Moreover, at Block 670, the resist removal process is repeated. This time the resist removal process removes the gate resist layer (from the stacked gate structure 90, the gate structure, and from other areas) as completely as possible. The protective layer 5 protects the stacked gate structure 90. In particular, damage to the tunnel oxide layer 10 at edges 18 and 16 and to the ONO layer 30 at edges 14 and 12 is controlled and minimized. Thus, the repeated resist removal process may result in some slight additional damage or no additional damage to the tunnel oxide layer 10 and the ONO layer 30, providing benefits in yield and reliability with respect to the flash memory device 300. Additional fabrication processing, such as ion implantation oxidation, can occur.

The foregoing descriptions of specific embodiments of the present invention have been presented for purposes of illustration and description. They are not intended to be exhaustive or to limit the invention to the precise forms disclosed, and many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A method of protecting a first structure on a semiconductor wafer during fabrication, comprising:
    a) performing a resist removal process on said semiconductor wafer to remove a first resist layer defining said first structure;
    b) depositing a resist removal protective layer on said first structure to protect said first structure during said resist removal process; and
    c) repeating said resist removal process on said semiconductor wafer to remove a second resist layer defining a second structure on said semiconductor wafer.

2. The method as recited in claim 1 wherein said resist removal protective layer is one of silicon-rich nitride, silicon oxynitride, and silicon dioxide.

3. The method as recited in claim 1 wherein a thickness of said resist removal protective layer is approximately between 30 angstroms and 50 angstroms.

4. The method as recited in claim 1 wherein a thickness of said resist removal protective layer is no smaller than approximately 30 angstroms.

5. The method as recited in claim 1 wherein a thickness of said resist removal protective layer is no greater than approximately 50 angstroms.

6. The method as recited in claim 1 wherein said step b) comprises:
    depositing said resist removal protective layer using a rapid thermal chemical vapor deposition process.

7. The method as recited in claim 1 wherein said step b) comprises:
    depositing said resist removal protective layer using a low pressure chemical vapor deposition process.

8. The method as recited in claim 1 wherein said step b) comprises:
    depositing said resist removal protective layer using a plasma enhanced chemical vapor deposition process.

9. The method as recited in claim 1 wherein said resist removal process comprises:
    using a plasma strip process; and
    using a wet chemical clean process.

10. The method as recited in claim 1 wherein said first structure comprises a stacked gate structure including a tunnel oxide layer, a floating gate layer, an ONO layer, and a control gate layer.

11. The method as recited in claim 1 wherein said first structure comprises a stacked gate structure including a first oxide layer, a nitride layer representing a floating gate, a second oxide layer, and a control gate layer.

12. The method as recited in claim 1 wherein said second structure comprises a gate structure including a gate oxide layer and a gate layer.

13. A method of protecting a stacked gate structure of a first semiconductor device during fabrication, comprising:
    a) performing a resist removal process to remove a first resist layer which defines said stacked gate structure;
    b) depositing a resist removal protective layer on said stacked gate structure to protect said stacked gate structure during said resist removal process; and
    c) repeating said resist removal process to remove a second resist layer which defines a gate structure of a second semiconductor device.

14. The method as recited in claim 13 wherein said resist removal protective layer is one of silicon-rich nitride, silicon oxynitride, and silicon dioxide.

15. The method as recited in claim 13 wherein a thickness of said resist removal protective layer is approximately between 30 angstroms and 50 angstroms.

16. The method as recited in claim 13 wherein a thickness of said resist removal protective layer is no smaller than approximately 30 angstroms.

17. The method as recited in claim 13 wherein a thickness of said resist removal protective layer is no greater than approximately 50 angstroms.

18. The method as recited in claim 13 wherein said step b) comprises:
    depositing said resist removal protective layer using a rapid thermal chemical vapor deposition process.

19. The method as recited in claim 13 wherein said step b) comprises:
    depositing said resist removal protective layer using a low pressure chemical vapor deposition process.

20. The method as recited in claim 13 wherein said step b) comprises:
    depositing said resist removal protective layer using a plasma enhanced chemical vapor deposition process.

21. The method as recited in claim 13 wherein said resist removal process comprises:
    using a plasma strip process; and
    using a wet chemical clean process.

22. The method as recited in claim 13 wherein said stacked gate structure comprises a tunnel oxide layer, a floating gate layer, an ONO layer, and a control gate layer.

23. The method as recited in claim 13 wherein said stacked gate structure comprises a first oxide layer, a nitride layer representing a floating gate, a second oxide layer, and a control gate layer.

24. The method as recited in claim 13 wherein said gate structure comprises a gate oxide layer and a gate layer.

25. The method as recited in claim 13 wherein said first semiconductor device is a flash memory device.

26. The method as recited in claim 13 wherein said second semiconductor device is a MOS transistor.

27. A method of fabricating an integrated circuit device, comprising:
    a) forming a resist layer for patterning a stacked gate structure;
    b) performing a first etching process to define said stacked gate structure;

c) performing a resist removal process on said integrated circuit device to remove said resist layer;

d) depositing a resist removal protective layer on said stacked gate structure to protect said stacked gate structure during said resist removal process;

e) forming a second resist layer for patterning a gate structure;

f) performing a second etching process to define said gate structure; and g) repeating said resist removal process on said integrated circuit device to remove said second resist layer.

28. The method as recited in claim 27 wherein said resist removal protective layer is one of silicon-rich nitride, silicon oxynitride, and silicon dioxide.

29. The method as recited in claim 27 wherein a thickness of said resist removal protective layer is approximately between 30 angstroms and 50 angstroms.

30. The method as recited in claim 27 wherein a thickness of said resist removal protective layer is no smaller than approximately 30 angstroms.

31. The method as recited in claim 27 wherein a thickness of said resist removal protective layer is no greater than approximately 50 angstroms.

32. The method as recited in claim 27 wherein said step d) comprises:

depositing said resist removal protective layer using a rapid thermal chemical vapor deposition process.

33. The method as recited in claim 27 wherein said step d) comprises:

depositing said resist removal protective layer using a low pressure chemical vapor deposition process.

34. The method as recited in claim 27 wherein said step d) comprises:

depositing said resist removal protective layer using a plasma enhanced chemical vapor deposition process.

35. The method as recited in claim 27 wherein said resist removal process comprises:

using a plasma strip process; and using a wet chemical clean process.

36. The method as recited in claim 27 wherein said stacked gate structure comprises a tunnel oxide layer, a floating gate layer, an ONO layer, and a control gate layer.

37. The method as recited in claim 27 wherein said stacked gate structure comprises a first oxide layer, a nitride layer representing a floating gate, a second oxide layer, and a control gate layer.

38. The method as recited in claim 27 wherein said gate structure comprises a gate oxide layer and a gate layer.

* * * * *